United States Patent [19]
Tanaka

[11] 4,161,699
[45] Jul. 17, 1979

[54] SECOND DERIVATIVE MEMORY-SAVING ALL CHANNEL DIGITAL TUNING SYSTEM

[75] Inventor: Akio Tanaka, Chicago, Ill.

[73] Assignee: Zenith Radio Corporation, Glenview, Ill.

[21] Appl. No.: 866,876

[22] Filed: Jan. 3, 1978

[51] Int. Cl.² ............................................. H04B 1/26
[52] U.S. Cl. ...................................... 325/464; 334/15
[58] Field of Search ................................ 325/420–422, 325/453, 459, 464, 468; 358/191; 334/11, 14, 15

[56] References Cited

U.S. PATENT DOCUMENTS 3,715,687  2/1973  Solender .............................. 325/453

*Primary Examiner*—Marc E. Bookbinder

[57] ABSTRACT

A tuning system for a television receiver includes fine tune memories and tuning information memories, the latter having reference channel nominal tuning information for each of the various frequency bands, first increment tuning information for each frequency band and second increment tuning information for each channel. The first increment information represents the initial slope of the tuning characteristic and the second increment information represents the slope of the slope of the tuning characteristic for each channel. Accumulator means add the reference channel and first and second increment informations to derive nominal tuning information for any selected channel. Control logic including counters and latches control the operation of the accumulator means and memories. The accumulator means and fine tune counters are interrogated by counter-driven comparators which develop pulse-width modulated signals corresponding to the tuning information therein. A tuning voltage generator develops the final tuning voltage from the pulse-width modulated signals. Increment tuning information representative of the slope of the tuning characteristic at each channel is derived and used to equalize any auxiliary tuning source. The reference channel information is combined with appropriate numbers of first tuning increments and second tuning increments for deriving nominal tuning information for the selected channel.

22 Claims, 9 Drawing Figures

SECOND DERIVATIVE MEMORY-SAVING ALL CHANNEL DIGITAL TUNING SYSTEM

CROSS REFERENCE TO RELATED PATENT APPLICATION

This application is related to, but not dependent upon, the invention and apparatus disclosed in copending application Ser. No. 791,897 filed Apr. 28, 1977 and application Ser. No. 807,627 filed June 17, 1977, both in the name of Akio Tanaka and assigned to Zenith Radio Corporation.

FIELD OF THE INVENTION

This invention relates generally to digital tuning systems and in particular to all-electronic television receiver digital tuning systems having a memory for storing tuning information.

BACKGROUND OF THE INVENTION AND PRIOR ART

Varactor diode tuners have contributed to the simplification of tuning systems in general, and television receiver tuning systems in particular. In such tuners, which are often referred to as electronic tuners, the varactor diodes exhibit capacitance variations with changes in bias voltage and serve as the variable reactances in-otherwise-conventional tuned circuits. Such tuning systems are easy to tune, free from RF signal carrying contacts and afford the designer great versatility in receiver styling. As pointed out in the related applications, their most serious drawbacks are the limited range of diode capacitance change and the nonlinear relationship between frequency and bias voltage.

The invention in the first-mentioned related application (Ser. No. 791,897)—now U.S. Pat. No. 4,142,157—provides an attractive solution to these problems and the problems associated with implementation of the Federal Communications Commission so-called "equal tuning" rule for VHF and UHF television channels. In brief, that system produces a separate "slope factor" which is related to the slope of the tuning voltage-versus-frequency characteristic for proportioning the "fine" tuning voltage such that equal frequency excursions are experienced for equal tuning information increments. The result is a truly "equalized" tuning system. The slope factors are stored in appropriate channel-number-addressable memories as are the nominal (coarse) tuning informations and fine tuning informations. For each channel selection a nominal tuning voltage information, a fine tuning voltage information and a slope factor are produced. The fine tuning information is multiplied by the slope factor and combined with the nominal tuning information for conversion to the final tuning voltage.

The invention in the second-mentioned copending application Ser. No. 807,627 is concerned with memory utilization in digital tuning systems and the savings in memory which may be achieved by proper utilization of the slope factor. The structure of that invention accomplishes significant memory reduction by storing initial value tuning information for a pseudo channel in each frequency band and separate tuning increment information, representing the tuning voltage changes required to successively tune from one channel to the next, beginning with the pseudo channel. (These increments are the difference equation analog of the slope factors defined in the application Ser. No. 791,897— now U.S. Pat. No. 4,142,157—). Upon occurrence of a channel change, an arithmetic computation is performed in which the initial value information and successive increment informations are added. The initial value tuning information is selected at a point 6 MHz below the lowest numbered channel in the band which point is then referred to as the pseudo channel number. Thus, in the low VHF band, for instance, rather than storing complete information words corresponding to the nominal tuning information for channels 2–4, the nominal tuning information for pseudo channel 1 is stored along with the slope factors or increments required to go from pseudo channel 1 to real channel 2, from channel 2 to channel 3, and from channel 3 to channel 4. Suitable logic and apparatus are provided for summing the pseudo channel information and successive increments for obtaining the nominal tuning information corresponding to the selected channel number.

Since the last increment represents the slope factor of the tuning curve at the selected channel, and since this slope information is separately available, it is readily usable for equalization of any auxiliary tuning voltage source to provide true equalized tuning for the system. In the offset fine tuning system disclosed, one-half of the fine tune information, after equalization, is added to the derived nominal tuning information to produce the final tuning information for the selected channel.

There is no art known to the inventor which is relevant to the invention described and claimed; that is a system which "computes" a tuning voltage by algebraic summation of nominal tuning information for a reference channel and increment tuning information representative of tuning differences between channels.

The present invention represents a further improvement in memory utilization over that obtainable in the system of the Ser. No. 807,627 application. In essence, only the differences in increment tuning information from channel to channel are stored in the memory. Effectively these difference increments result from taking the "slope of the slope" of the tuning characteristic at each channel tuning position, and may be conveniently referred to as a second derivative system. Thus rather than storing a tuning information increment equivalent to a one volt tuning change for example, only the tuning increment change for that channel, which may amount to only a tenth of a volt, is stored and thus a substantial further savings in memory is obtainable. The nominal tuning information for the selected channel is derived by summing the nominal tuning information for the pseudo channel and first increment tuning information in that band with the appropriate number of successive second increment tuning informations. The first and second increment tuning informations are added to produce a last tuning increment for the selected channel, which is the slope factor, and which may be conveniently used to produce equalized tuning as disclosed in the Ser. No. 791,897 application.

OBJECTS OF THE INVENTION

The principal object of this invention is to provide a novel television tuning system.

Another object of this invention is to provide a television tuning system requiring less memory.

SUMMARY OF THE INVENTION

In accordance with the invention a television receiver includes a voltage controlled tuner having a nonlinear tuning voltage-versus-frequency characteristic, tuning voltage means for generating a tuning voltage for the tuner and memory means storing reference tuning information, first increment tuning information related to the slope of the characteristic at a base channel and second increment tuning information related to the slope of the slope of the tuning characteristic at each channel position. The memory means supply the tuning informations to accumulator means which generate therefrom the nominal tuning information and slope factor for the selected channel.

BRIEF DESCRIPTION OF THE DRAWINGS

The invention and its objects will best be understood by reference to the detailed description of the preferred embodiment thereof in conjunction with the drawings in which.

IC DETAILS

IC DM8130 is available from National Semiconductor Corporation of Santa Clara, Calif. All others are available from Texas Instruments Corporation of Dallas, Tex.

The schematic diagrams have been simplified to aid in describing the invention. All integrated circuits used are "off-the-shelf" items obtainable under the given designations from the identified sources. Only terminals that change logic states are shown. All $V_{CC}$ terminals are connected to 5 volts D.C. and all ground terminals are connected to 0 volts. Unused outputs are left open. Device pin numbers have not been used since they are nondescriptive and difficult to follow. Some terminal designations are abbreviated; in the memories, any $A_0$–$A_7$ terminals are referred to as $A_A$–$A_H$ for consistency.

Input terminals that do not change logic states are connected as follows:

| Device | Ref. # | Description | Inputs to 0v. | Inputs to 5v. |
|---|---|---|---|---|
| DM8130 | 301 | comparator | $S,A_0,A_9,B_0$ $B_9$ | |
| SN7475 | 302,303 | latch | | |
| SN74190 | 304,305 | counter | $D_A,D_B,D_C,$ $D_D,EG$ | |
| SN74393 | 321,322 | binary counter | | |
| SN74S139 | 323,324 | decoder | E1G,E2G | |

-continued

| Device | Ref. # | Description | Inputs to 0v. | Inputs to 5v. |
|---|---|---|---|---|
| SN74S281 | 402–404 452–454 | accumulator | $M,C_n,RC,RS1,$ $RS0,A0$–$A3$ | AS1 |
| SN74S287 | 412–413 | memory | $\overline{CS1},\overline{CS2}$ | |
| SN74161 | 422–424 | binary counter | A,B,C,D | EP,ET, CL,L |
| SN7485 | 432–434 442–444 532,533 | comparator | A<B,A>B | A=B |
| TMS2101 | 512,513 | memory | $\overline{CET},\overline{OE}$ | CE2 |
| SN74191 | 522,523 | binary counter | EG | |

DESCRIPTION OF THE PREFERRED EMBODIMENT

SYSTEM BLOCK DIAGRAM (FIG. 1)

Figure 1:
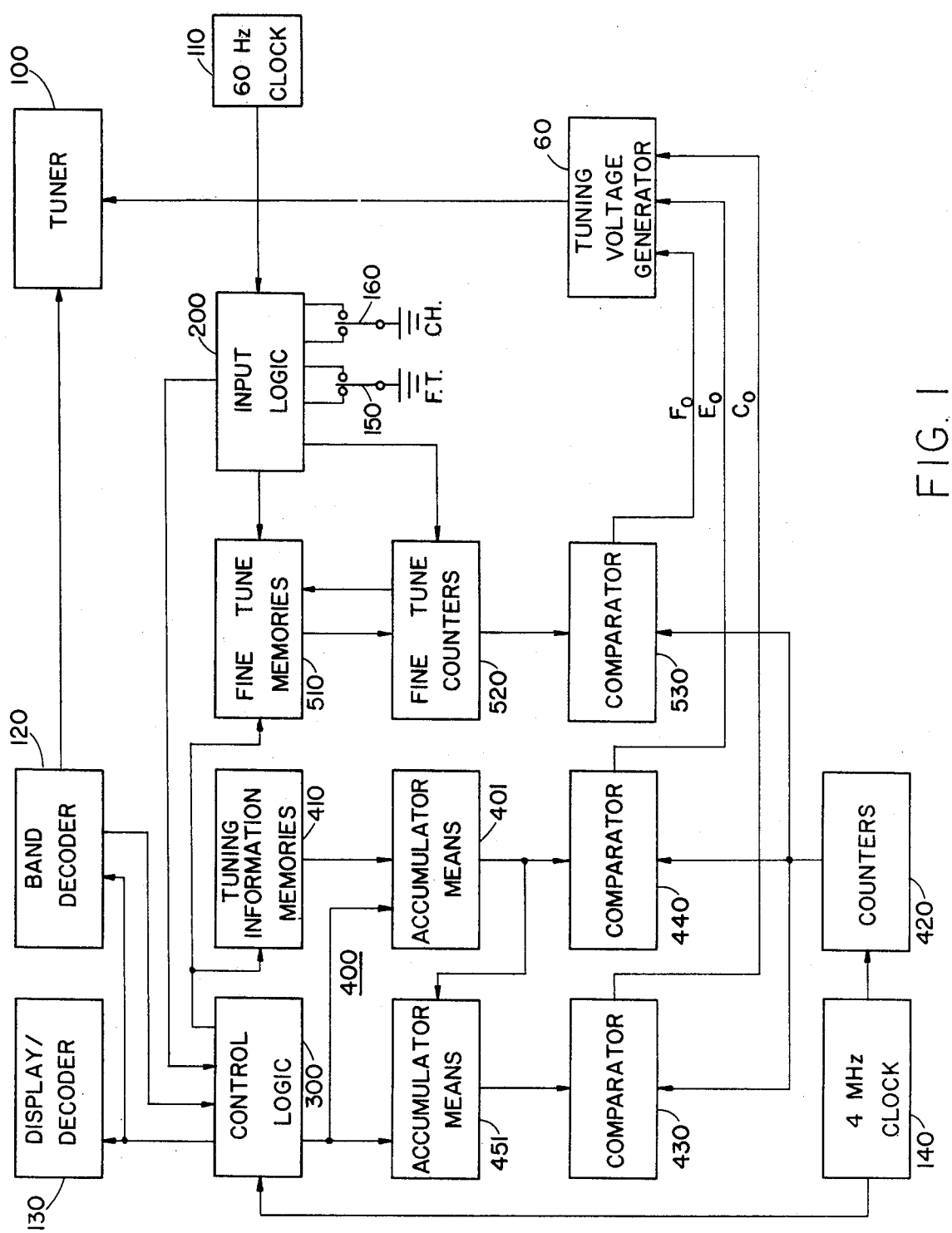
FIG. 1 is a block diagram of a television tuning system constructed in accordance with the invention.

In FIG. 1 a television tuning system includes a tuner 100, a tuning voltage generator 60, a 60 Hz clock 110, a band decoder 120, a display/decoder 130 and a 4 MHz clock 140. An input logic circuit 200 is supplied by the 60 Hz clock and supplies control logic 300 and the fine tuning section 500, specifically fine tune memories 510 and fine tune counters 520. A fine tuning Up/Dn (up/down) switch 150 and a channel Up/Dn switch 160 are connected to input logic circuit 200. A nominal tuning section 400 includes an accumulator means 401, an accumulator means 451, tuning information memories 410, a pair of comparators 430 and 440 and counters 420.

Control logic 300 supplies display/decoder 130, band decoder 120, accumulator means 401, accumulator means 451 and tuning memories 510 and 410, the latter being coupled to accumulator means 401, which in turn is coupled to comparator 440 and accumulator means 451. Band decoder 120 feeds control logic 300 and tuner 100. Accumulator means 451 supplies comparator 430. The other inputs of comparators 430 and 440, and comparator 530 in the fine tuning section, are supplied from counters 420. The informations contained in both accumulator means and the fine tune counters are read out by the comparators as a plurality of pulse width modulated (PWM) signals $C_o$, $E_o$ and $F_o$ representing nominal tuning information, equalization information, and fine tuning information respectively. These informations are supplied to tuning voltage generator 60 from which the tuning voltage for tuner 100 is produced. The 4 MHz clock 140 drives control logic 300 and counters 420.

As will be explained in greater detail with reference to the schematic diagrams, tuning information memories 410 include channel-number-accessible initial value reference or pseudo channel nominal tuning information and initial value slope or first increment tuning information for the different frequency bands, and second increment tuning information for each channel. When a channel is selected, the initial value nominal tuning information and first increment tuning information for the band are supplied to the accumulator means along with all second increment tuning information between the pseudo channel and the selected channel. There the nominal tuning information for the selected channel is derived by summation of the initial value informations and the second increment information. Last increment information (i.e., the summation of first increment and appropriate ones of second increment informations) are computed separately for equalization of secondary tuning voltage sources, such as a source of fine tune information or AFC information. Both accumulator means are interrogated to develop the coarse tuning information $C_o$ and the equalization information $E_o$. Similarly in the fine tune section the $F_o$ signal is produced. The fine tune memories are intercoupled with the fine tune counters and adjustable via the fine tune switch. Comparators 530 are connected to counters 520.

INPUT LOGIC 200 (FIG. 2)

Figure 2:
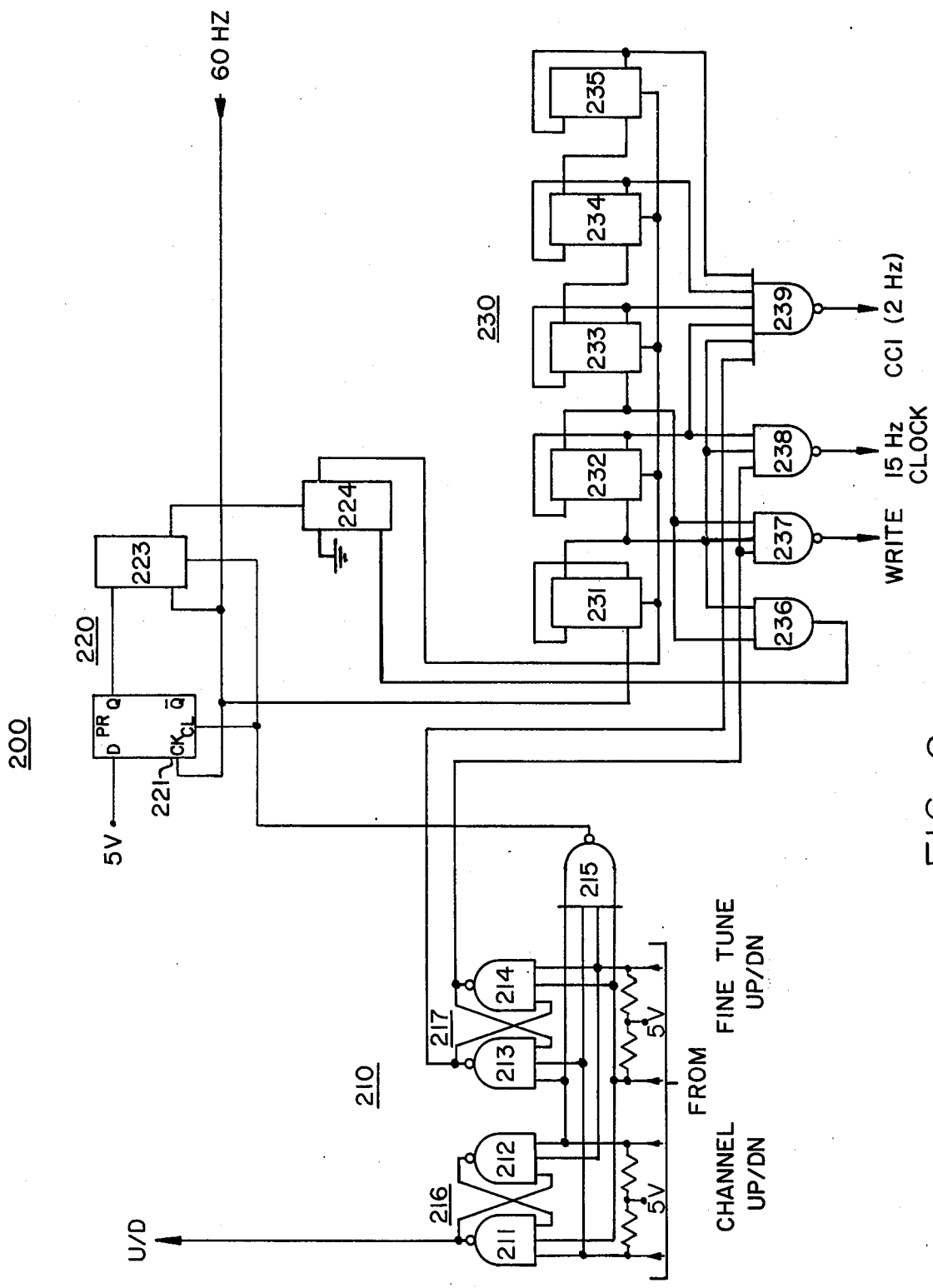
FIG. 2 is a schematic representation of input logic 200.
Figure 3:
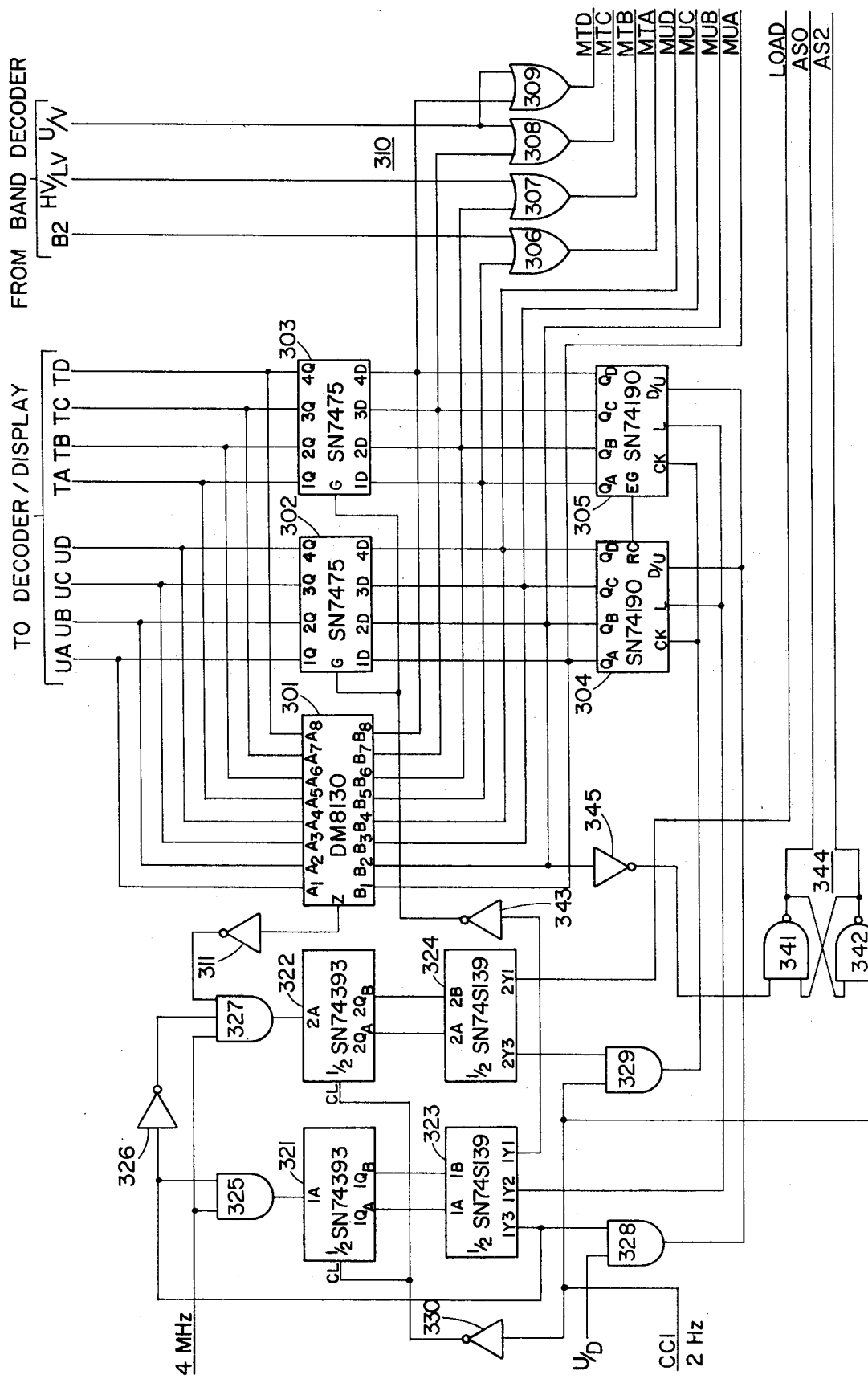
FIG. 3 is a schematic representation of control logic 300.

The input logic circuit 200 of FIG. 2 includes an input latch circuit 210 comprising two pairs of cross-coupled NANDS 211-212, and 213-214 and an initiation circuit NAND 215. Each input to the latch circuit is tied to 5V through an appropriate resistor for noise immunity. NANDS 211 and 212 form an RS flip flop 216 for producing and maintaining a U/D (up/down) signal in response to actuation of the channel Up/Dn switch or the fine tune Up/Dn switch. NANDS 213 and 214 comprise an RS flip flop (FF) 217 for enabling the gates controlling the channel change initiate (CCI) pulse of approximately 2 Hz and the fine tune write and clock signals of 15 Hz. As its name implies, initiation NAND 215 starts the 60 Hz countdown counters operating in response to either a channel Up/Dn signal or a fine tune Up/Dn signal.

A "deglitch" circuit 220 comprises a FF 221 and a FF 223 for preventing contact bounce or the like from initiating a channel change or fine tune cycle. FF 224 assures completion of a cycle, once started. Deglitch circuit 220 cooperates with input latch 210 and the 60 Hz clock pulses for controlling operation of countdown counter 230, comprising five serially connected FF's 231-235, which develops the low frequency fine tune write, fine tune clock and channel change initiate signals. Three NANDS 237-239 are arranged to decode the different counter states and produce appropriate frequency clocking signals. AND 236 assures production of the write pulse before allowing counter 230 to terminate operation.

In detail, one pole of the channel Up/Dn switch is coupled to a first input each of NANDS 211, 213 and 215, the other pole being coupled to a first input of NAND 212 and second inputs of NANDS 213 and 215. One pole of the fine tune Up/Dn switch is coupled to a second input of NAND 211, a first input of NAND 214 and a third input of NAND 215. The other pole is coupled to a second input of each of NANDS 212 and 214 and the last input of NAND 215. As mentioned, NANDS 211 and 212 are also cross-coupled (output of each connected to an input of the other) to form RS FF 216. The output of NAND 211 produces the U/D signal. Similarly NANDS 213 and 214 are cross-connected to form RS FF 217. The output of NAND 213 is connected to an input of CCI signal NAND 239 and the output of NAND 214 is coupled to an input each of fine tune NANDS 237 and 238. These RS FF outputs enable the respective connected NANDS.

The output of initiation circuit NAND 215 is coupled to the CL terminals of FF 221 and FF 223. D of FF 221 is connected to 5V; its Q output being connected to D of FF 223. A 60 Hz clock signal is connected to the CK terminals of FF's 221 and 223 and also to the CK terminal of FF 231 in counter 230. $\bar{Q}$ of FF 223 is coupled to PR of FF 224, the Q output of which provides a reset signal for FF's 231-235 in counter 230.

The FF's in counter 230 are arranged conventionally with the Q of the first FF 231 coupled to the CK of the second FF 232, and so forth. The $\bar{Q}$ terminals of each flip flop are connected to the D terminals of the same flip flop. Q of FF 231 is connected to a first input of AND 236 and second inputs of NANDS 237-239. Q of FF 232 is connected to a second input of AND 236 and a third input of NAND 237. $\bar{Q}$ of FF 232 is connected to a third input of NAND 238 and 239. The $\bar{Q}$'s of FF's 233-235 are each connected to further input of NAND 239. As mentioned, all of the CL reset terminals for FF's 231-235 are connected to the Q terminal of FF 224. The output of NAND 237 supplies the 15 Hz fine tune write signal, the output of NAND 238 the 15 Hz fine tune clock signal and the output of NAND 239 the approximately 2 Hz CCI signal. The output of AND 236 is connected back to CK of FF 224.

CONTROL LOGIC 300 (FIG. 3)

Operation of the channel Up/Dn switch produces a U/D signal for the channel number counters which determines the direction of counting. A channel-change-initiate (CCI) signal is also produced and enables a four-state state counter and decoder arrangement which is clocked at a 4 MHz rate. The counter is reset to its first state by the CCI signal. In the second state it fixes the new channel number in the units and tens latches. In state 3 the channel counters are reset to zero and in state 4 the state counter is disabled.

Disabling of the state counter enables a four-state addition control counter and decoder which were also reset to state 1 by the CCI signal. In state 2 the registers in the accumulator means are "loaded" with the outputs of the arithmetic logic units (also in the accumulator means) and in state 4 the channel counters are stepped one count. State 3 is not used. The addition control counter continues to cycle through its states and adds the contents of each accessed memory location into the accumulators until the channel counters match the number stored in the latches. A comparator determines when this condition occurs and disables the system. The information then in the accumulators represents the nominal tuning information for the selected channel number in the latches.

In detail, a comparator 301 is connected between the outputs of a pair of channel counters 304-305 and channel number latches 302-303. The outputs of the latches are also connected to display/decoder 130 and band decoder 120 in FIG. 1. Latch 302 presents the binary coded decimal (BCD) units digit (UA-UD) at its 1Q-4Q terminals. Latch 303 presents the BCD tens digits TA-TD at its 1Q-4Q terminals. 1Q-4Q of latch 302 are connected to $A_1$-$A_4$, respectively, of comparator 301 and 1Q-4Q of latch 303 are connected to $A_5$-$A_8$. On the counter side, $Q_A$-$Q_D$ of counter 304 are connected to $B_1$-$B_4$, respectively and $Q_A$-$Q_D$ of counter 305 connected to $B_5$-$B_8$, respectively. Units counter 304 has its $Q_A$-$Q_D$ output terminals connected to the 1D-4D input terminals of latch 302 and tens counter 305 has its $Q_A$-$Q_D$ terminals connected to 1D-4D of latch 303. The BCD units digit is conveyed directly to the tuning information memories over leads MUA-MUD. As will be explained under "Memory Organization", the BCD tens digit is supplied through OR gates 306-309 in a memory address translator 310. The other inputs of these OR gates are supplied from the band decoder. The U/V line is high for VHF, HV/LV is high for channels 2-6 and B2 is high for channels 5 and 6. The translator outputs go to the tuning information memories over leads labelled MTA-MTD.

The reset (CL) terminals of state counter 321 and addition control counter 322 are connected together and supplied with the 2 Hz CCI signal through an inverter 330. An AND 325 and an AND 327 supply clock terminals 1A and 2A respectively of counters 321 and 322. One input of each of these ANDS is supplied with a 4 MHz signal. The second input of AND 325 is coupled to terminal 1Y3 of state decoder 323 and, through an inverter 326, to a second terminal of AND 327. The last input of AND 327 is supplied, through an inverter 311, from the Z terminal of comparator 301.

The $1Q_A$ and $1Q_B$ outputs of state counter 321 are coupled respectively to the 1A and 1B inputs of state decoder 323. Similarly, the $2Q_A$ and $2Q_B$ outputs of addition control counter 322 are coupled to the 2A and 2B inputs of state decoder 324. The 1Y1 output of state decoder 323 is connected, through an inverter 343, to the G terminals of latches 302 and 303. The 1Y2 terminal is connected to the L terminals of channel counters 304 and 305 and the 1Y3 terminal connected to an input of AND 328. The other input of AND 328 is supplied with the U/D signal. The 2 Hz CCI signal is coupled to a first input each of AND 329 and NAND 342. ANDS 328, 329 supply D/U and CK of counter 304, 305. The 2Y1 output of state decoder 324 carries the load signal for the accumulators. The 2Y3 output is connected to the second input of AND 329. The $Q_B$ output of counter 304 is connected to an input of a NAND 341 through an inverter 345. NANDS 341 and 342 are cross-coupled and form an RS FF 344. The output of NAND 341 carries the AS0 signal and the output of NAND 342 carries the AS2 signal for the accumulators. As will be explained, the AS0 and AS2 signals determine the operating mode of the accumulators.

NOMINAL TUNING INFORMATION SECTION 400 (FIG. 4)

The nominal tuning section contains the accumulators and the tuning information memories as well as the comparators and counters for reading out their contents. These memories include initial value nominal tuning information and first increment tuning information for each frequency band and second increment tuning information for each channel. The system is believed most easily understood by considering the memory organization at the same time the nominal tuning information computation is discussed.

MEMORY ORGANIZATION

The commercially available memory disclosed can store 256 words and is addressed by 8 lines. Four lines are for the BCD units digit (MUD, MUB, MUC and MUA) and four lines for the BCD tens digit (MTD, MTC, MTB and MTA). The memories are schematically shown for simplicity. Their internal arrangements are well-known in the art. The FCC allocated channel numbers for the television frequency spectrum extend from 2-83. The arrangement enables storage and retrieval of initial value tuning information for each of the frequency bands, initial value slope or first increment tuning information for each of the frequency bands as well as the second increment tuning information for the individual channels in the bands, with very minimal structure. Each four bits defines 16 binary states which may be labelled (using hexadecimal notation) as 0, 1, 2, . . . 9, A, B, C, D, E, F. Each memory location thus has an "x" (tens) and a "y" (units) coordinate, each of which ranges from O-F. The address of memory location 1 is OO, whereas the address of location 256 is FF.

The BCD units digit from the channel number counters is supplied directly to the corresponding units inputs in the memories. The BCD tens digit is routed through the four OR gates in the memory address translator, the other inputs of which are supplied from the band decoder. For VHF channels the band decoder forces certain of the OR gate outputs to access displaced memory locations. For UHF, the BCD tens digit is directly supplied to the tuning information memories.

In the UHF band (channels 14-83) the pseudo channel 13 nominal tuning information is stored in memory location 00, while channel 14 first increment tuning information is stored in memory location 13 and second increment tuning informations for channels 15, 16, 17 . . . 83 are stored in memory locations 14-82, respectively. The intervening memory locations 01-12 are empty. Whereas the addresses of the UHF channel memory locations are straightforward, the VHF channel tuning informations are displaced in the memory by the memory address translator.

For example in the VHF low band (channels 2-4), the pseudo channel 1 nominal tuning information is stored in memory location E0, first increment tuning information is stored in memory location E1 and second increment tuning informations for channels 3 and 4 are stored in memory locations E2 and E3, respectively. In the VHF mid band (channels 5 and 6), the pseudo channel 4 nominal tuning information and first increment tuning information are stored in memory locations F0 and F4, respectively and second increment tuning information for channel 6 is stored in memory location F5. (Memory locations F1-F3 are programmed with zeros.) In the VHF high band (channels 7-13) the pseudo channel 6 nominal tuning and first increment information are stored in memory locations C0 and C6, respectively and second increment tuning informations for channels 8, 9, 10, 11, 12 and 13 are stored in memory locations C7, C8, C9, D0, D1 and D2 respectively. All other memory locations are programmed with zero.

As mentioned, the initial value nominal and first increment tuning informations are determined from the tuning curve for each band for a pseudo channel 6MHz below the lowest numbered channel in the band. For low VHF, pseudo channel 1 is used, for mid VHF, pseudo channel 4, etc. The first increment (slope of the tuning characteristic at the pseudo channel) represents the tuning voltage change between the pseudo channel and its adjacent real channel. Thus, the first increment for the low band VHF is determined by the tuning voltage change needed to go from pseudo channel 1 to real channel 2. The second increment tuning informations represent the changes in first increments to tune at successive channel positions.

Either a "zero offset" fine tuning system, in which the nominal tuning voltage is selected to lie on the tuning voltage curve, or a $\pm\frac{1}{2}$ fine tune voltage range offset may be employed. In the former, a $\pm$ fine tune voltage is used to vary tuning about the nominal tuning point. In the "offset" system, the nominal tuning voltage is selected to be $\frac{1}{2}$ the fine tune voltage range above or below the tuning curve. The fine tuning voltage source is thus normally at $\frac{1}{2}$ of its value. The disclosed system incorporates an offset of $\frac{1}{2}$ the fine tune voltage range below the tuning curve.

Similarly, the initial values of nominal and first increment tuning informations for the other pseudo channels in the respective bands are determined from the tuning curve at a point 6 MHz below the lowest numbered real channel. The initial values for the UHF band is determined at pseudo channel 13 (6 MHz below channel 14).

It will also be appreciated that a subtractive approach can readily be used in which the pseudo channels are selected to be 6 MHz above the highest channel in the band and the accumulators arranged to subtract rather than add.

When a viewer selects a channel for viewing, the channel number appears in the channel counters and is stored in the latches, the appropriate memory location is accessed (in accordance with the above translation performed by the band decoder and the tens digit signals) and the channel counters are reset to 00. This latter action "sets the stage" for counting through the memory locations and, as will be seen, clears the accumulator means of previously stored information. Thus for channel 2, the memory location initially accessed is E2. Upon reset of the channel number counters, memory location E0 is accessed where the initial tuning information for pseudo channel 1 is stored. (At memory location E1 the first increment information is stored and channel 3 second increment tuning information is stored at memory location E2.)

It should be noted that the accumulators are arranged in the disclosed embodiment to transfer data on the accumulator inputs to the respective registers (without addition) for the channel counts 00 and 01 and to add for all other counts. Counts 00 and 01 correspond to memory locations E0 and E1 in band 1, F0 and F1 in band 2, C0 and C1 in band 3 and 00 and 01 in the UHF band, respectively. The counters are then stepped to match the number in the latches. In so doing, memory locations E0 and E1 are interrogated and their contents transferred to respective register portions of the accumulators. When location E2 is addressed, comparator 301 indicates equality and operation terminates. The resulting increment information represents the slope at the channel 2 tuning position and is used to "equalize" the fine tune information. The fine tune counter is normally set at its mid range and in conjunction with the equalized fine tune information provides the rest of the nominal tuning voltage for channel 2.

Carrying the illustration further, for channel number 5, memory location F5 is accessed and, when the channel counters are reset, memory location F0 is accessed. Initial value tuning information corresponding to pseudo channel 4 is stored at memory location F0 and the first increment tuning information is stored at memory location F4. As the channel counters are stepped from 00 and 05 (the selected channel number in the latch) memory positions F0-F4 are interrogated to arrive at the channel 5 nominal tuning information. It will be understood that in the above illustration, memory location F1-F3, inclusive are empty.

The illustrations teach the technique of memory location allocation and access without attempting to disclose refinements which would, obviously be made in a commercial application. For example two accumulators are depicted whereas it may readily be envisioned that a single accumulator with a pair of latches could be employed, with savings in apparatus. It should also be noted that the stored information may be dispersed in smaller bit groups in different memory locations and appropriately double summed to produce the desired reference tuning information and first increments when the first channels are reached.

The next band comprises the VHF Hi band (channels 7-13). The initial value tuning information for this band (corresponding to pseudo channel 6) is stored at memory location C0 and the first increment tuning information is stored at memory location C6. Assuming channel 9 is selected for viewing, memory locations C0-C8 are sequentially interrogated. At memory location C0, the initial value information is read out and at memory location C6 the first increment information. No information is stored at memory locations C1-C5 inclusive. Memory location C7 contains second increment information for channel 8 and location C8 second increment information for channel 9. Thus the channel 9 slope factor is obtained by adding the second increment for channels 8 and 9 to the initial increment. The nominal tuning information is obtained by adding the initial value tuning information and successive slopes for intermediate channels. (For channel 9 this would be the initial value, for pseudo channel 6 information, two first increments and one channel 8 second increment.)

Finally, for the UHF band, the channel counters access memory location 00 when reset to 00, where the initial value tuning information for pseudo channel 13 is stored. The first increment tuning information is stored at memory location 13. Locations 01-12 are empty. The second increment values for channels 15-83 are stored at memory locations 14-82, respectively. If channel 22 is selected, for example, memory locations 00-21 are interrogated as the channel counters are stepped to match the number 22 stored in the channel number latches. Memory locations 00 and 13 contain initial value tuning information and first increment information respectively. Memory locations 01 through 12, have no information. The second increment information at locations 14-21 is added to the first increment tuning information for deriving the slope factor for equalizing the fine tuning information source. One half of the equalized fine tune information is added to the nominal tuning information to develop the final tuning information for channel 22. The nominal tuning information in the registers of accumulators 452-454 will comprise, the initial value for pseudo channel 13, eight first increments, seven channel 15 second increments, six channel 16 second increments . . . and one channel 21 second increment.

It will be further appreciated that in a practical embodiment the memory will be "tailor made" and there will be few, if any, unused memory locations. The channel counters rapidly step from 00 to the number in the latch and all stored information is read out from the accessed memory locations. The counter stepping rate is 1 MHz and the maximum time to derive the nominal tuning information for any channel is less than 100 microseconds. Thus the system is instantaneous as far as the viewer is concerned.

Two groups of three serially connected accumulators 402, 403, 404 and 452, 453, 454 have load, AS0 and AS2 signals applied to their CK, AS0 and AS2 terminals, respectively. An accumulator is well-known in the art and includes an arithmetic logic unit (ALU) and a storage register. The accumulators specified are capable of performing numerous arithmetic and logic functions. For the present invention only the data transfer and addition modes are used. The memory outputs are coupled to the inputs of the ALU and the AS0 and AS2 signals control its operational mode. The ALU output is stored in the register under control of the load signal, and the summation product is taken from the output of the register. When AS0 is low and AS2 is high, the accumulator is in its transfer mode and the ALU operates to replace the information in the register with the information on the memory output leads upon occurrence of the load signal. When AS0 is high and AS2 is low, the accumulator is in its addition mode and the ALU operates to add the information on the memory output leads to that already in the register and upon occurrence of the load signal, the new sum is stored in the register.

The two tuning information memories 412 and 413 have their respective $A_A$-$A_H$ input terminals connected to the MUA-MTD leads from control logic 300. Their DO1-DO4 output terminals are connected to the A0-A3 input terminals of the respective accumulators 402 and 403. Accumulator 404 does not have any direct tuning information input, but is needed because of the summation of memory information which overflows into it.

The other group of accumulators 452-454 have their A0-A3 inputs connected to F0-F3 outputs of accumulators 402-404, respectively. Accumulators 452-454 develop the nominal tuning information consisting of the initial value tuning information and the sum of the appropriate numbers of first increments and corresponding second increments of tuning information for the desired channel. Accumulators 402-404 develop the equalizing or slope information from the first increment information and second increment informations. The F0-F3 outputs also supply the $E_2$-$E_{12}$ leads.

Accumulator 452 has its output terminals F0-F3 supplying the $C_1$-$C_4$ signals to the B0-B3 input terminals of a comparator 432. Comparators 433 and 434 are similarly arranged with respect to accumulators 453 and 454, the $C_5$-$C_8$ signals being supplied to comparator 433 and the $C_9$-$C_{12}$ signals to comparator 434. Three counters 422, 423 and 424 have their $Q_A$-$Q_D$ terminals connected to the A0-A3 inputs of comparators 432, 433 and 434, respectively. The comparators are serially connected and the $C_o$ signals—representing nominal tuning information—is taken from comparator 434.

As fully explained in the referent copending application, the comparators have a high value output when the count presented by the counter is less than the information in the memory and a low value for all other counts. The $C_o$ signal appears as a PWM signal with a duration representative of the memory content. Thus the count in the counter is a direct measure of the information at the particular memory location being interrogated.

Similarly comparators 442-444 are arranged to receive the $E_2$-$E_{12}$ signals from accumulators 402-404. $E_1$ is connected to ground. The other comparator inputs are connected to counters 422-424, respectively and their output is the $E_o$ signal (taken from comparator 444). It too is a PWM signal, the duration of which is directly related to the accumulator register content. A plurality of inverters enclosed by dashed line box 405 are shown interposed in the $E_1$-$E_{12}$ signal lines. This modification is required when using the tuning voltage generator of FIG. 7. In that case the $E_o$ alternate signal is also used. For the tuning voltage generator of FIG. 6 the inverters and $E_o$ alternate signal should be ignored.

NOMINAL TUNING EXAMPLE

Assume the receiver is tuned to VHF channel number 2 and the viewer decides to change the channel 3. When the receiver is tuned to channel 2, latch 302 contains a BCD "0" and latch 303 a BCD "2". The channel number is presented to the viewer via the display/decoder (with or without the leading "0" being blanked) and the band decoder presents appropriate signals to the OR's in memory translator 310, memory location E2 is accessed and appropriate tuning information is supplied to the tuner. Upon operation of the channel Up/Dn switch, the U/D signal goes low indicating an upward direction change in channel number. The low level U/D signal applied to AND 328 results in a low level output signal to the D/U terminals of channel number counters 304-305, conditioning them for counting up.

It was shown from the control logic in FIG. 2 that the 2 Hz CCI pulse signal is produced at the output of NAND 239. The "1Y3" output of state decoder 323 is low and inhibits AND 325. (AND 327 is inhibited by the inverted Z output of comparator 301.) When state counter 321 is reset, it drives 1Y3 high enabling AND 325 and further inhibiting AND 327. The CCI pulse is supplied through inverter 330 to state counter 321 and addition control counter 322 to reset them to their respective "1" states. The pulse is also applied to set RS FF 344 such that AS0 is low and AS2 is high, placing the accumulators in the data "transfer" mode (as distinct from the "add" mode). The 2 Hz pulse is applied to AND 329 which increments the channel counters one count, changing their content from 02 to 03.

The 4 MHz clock pulses to state counter 321 are now effective and it cycles to state "2" in which the 1Y1 output of decoder 323 goes low, resulting in transfer of the new channel number 03 into the channel number latches. When state "3" is reached, 1Y2 goes low to reset the channel number counters to "00". When 1Y3 goes low in state "4" if forces the channel counters to count in the up direction (overriding the U/D signal) by assuring that the output of AND 328 is low and disables state counter 321 and enables AND 327. At this time the inverted Z output of comparator 301 is high because the number (03) in the latches no longer matches the number (00) in the counters. Addition control counter 322 is clocked to its state "2" by the next 4 MHz pulse. When counter 322 is in state "2", its 2Y1 output is low which instructs accumulators 402-404 to "load" any information present on the accessed memory output terminals into its registers. At the same time, accumulators 452-454 are operated in parallel with accumulators 402-404, and the information in the registers of the latter displaces that in the register of the former. The initial value tuning information in memory location E0 is thus placed in the registers of accumulators 402-404, displacing the previous information for channel 2, which is transferred to the registers of accumulators 452-454. (The previously stored tuning information for channel 2 is displaced.)

When the addition control counter reaches state 4, its 2Y3 output, through AND 329, steps the channel number counters one count to 01.

Addition control counter 322 continues stepping in response to the 4 MHz clock pulses. When the 2Y1 output of state decoder 324 goes low again, information from the next memory location E1 is transferred into accumulators 402-404 and the information in their registers are transferred into accumulators 452-454. Since the first increment information is in memory location E1, this is transferred to the registers of accumulators 402-404 and the initial value tuning information for band 1 is transferred to the registers of accumulators 452-454. When the addition control counter again reaches state 4, 2Y3 steps the channel counters one count to 02. Note that the $Q_B$ output of units counter 304 is connected to NAND 341 in RS FF 344 through inverter 345. $Q_B$ goes from low to high as the counter goes from decimal count 1 to 2 (binary 01 to 10), which toggles RS FF 344. The AS0 output of RS FF 344 goes high and its AS2 output goes low which places the accumulator in the addition mode. In this mode, any information at the accumulator inputs is added to previous information and stored in the register, upon occurrence of a load signal.

Both the inputs and the output of AND 329 are normally high. When the CCI signal goes momentarily low, it drives one input of AND 329 low, thus forcing its output low and clocking the channel counters. Similarly, when 2Y3 goes low it clocks the channel counters. As the addition control counter is cycled between states 2 and 4, the channel counters are stepped one count and the information present on the accumulator inputs is transferred or added to the information already in the accumulator registers, depending upon the AS0 and AS2 signals. The information stored in accumulators 402-404 at this point is the first increment information from memory location E1. The information in accumulators 452-454 is the pseudo channel 1 nominal tuning information from memory location E0. As the channel number counters are stepped to 02, the second increment information for channel 3, which is stored in memory location E2, is added to the first increment information in accumulators 402-404 and the first increment information is added to the pseudo channel 1 information in accumulators 452-454. When the counter is stepped to read 03 corresponding to the channel number stored in the latch, operation terminates.

If the viewer wants channel 4, the Up/Dn switch is held until the display/decoder indicates channel 4. The viewer may of course tune by watching the TV picture instead of the channel number display. Tuning occurs so rapidly that the 2 Hz CCI signal yields more than enough time to completely step through all relevant memory locations for each change in channel number. Thus when channel number 4 is put in the latch, memory locations E0-E3 are interrogated.

Assuming that the viewer releases the Up/Dn channel switch when channel 4 appears on the display (or is received by the receiver) the channel number in the latch and the channel number in the counter again match each other and the Z output of comparator 301 goes high which, due to inverter 311, places a disabling signal on AND 327, thus stopping further counting of addition control counter 322.

Those skilled in the art will readily appreciate that because of the extremely high speed at which the information is accumulated there is no discernible tuning time penalty in "double summing-from-zero" for each channel number increment.

FINE TUNING SYSTEM 500 (FIG. 5)

This section is substantially identical to that disclosed in the above-mentioned copending applications.

In this section, additional counters are employed for electrically altering the corresponding fine tune memories' contents in accordance with viewer preferences. The fine tune memories are interrogated each time a CCI signal is received from the input logic (FIG. 2). The comparators operate in the same manner as the comparators for the tuning information memories. The fine tuning information is automatically updated in the memories by the input logic, responsive to operation of the fine tune Up/Dn switch.

Figure 4:
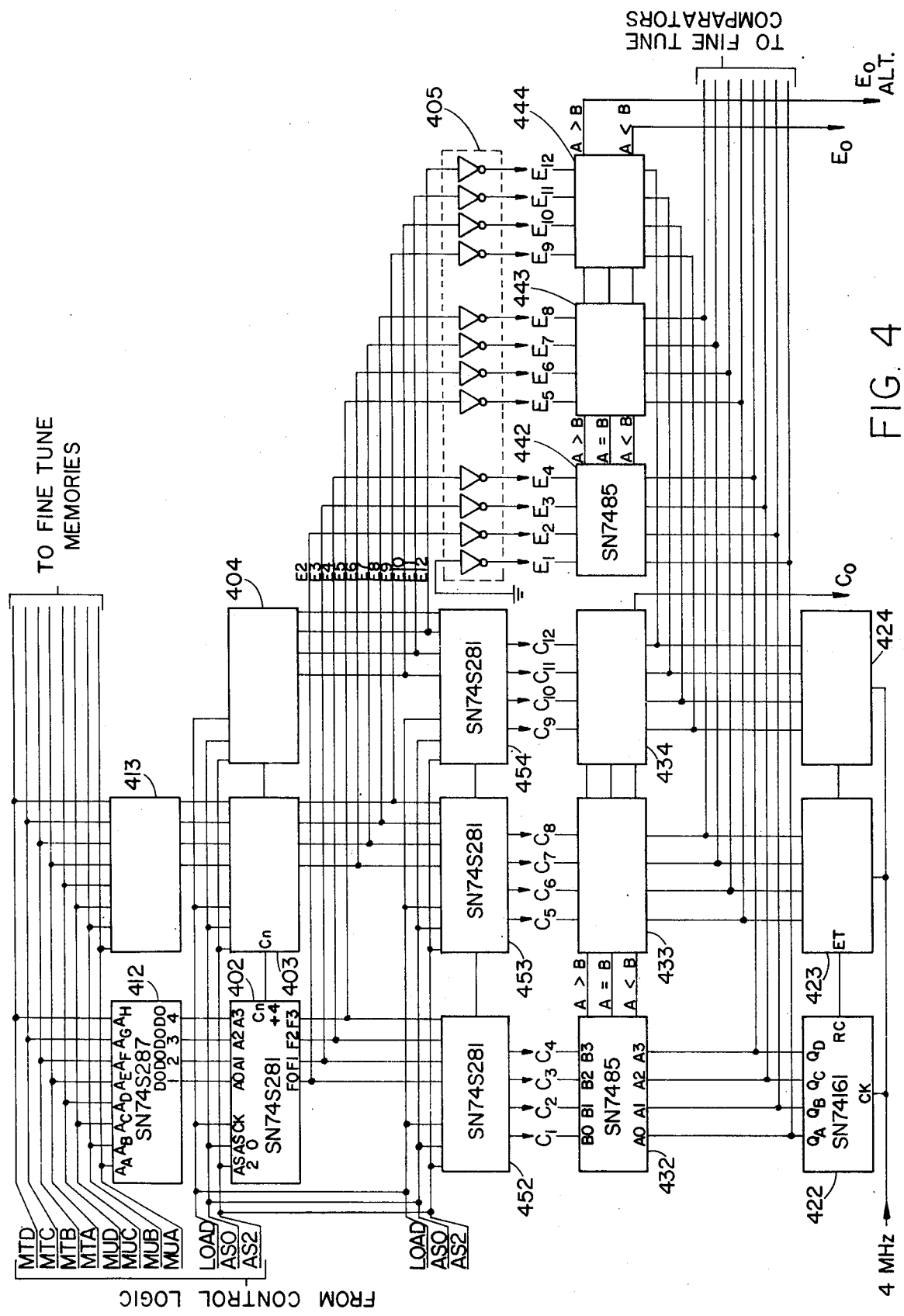
FIG. 4 is a schematic representation of nominal tuning section 400 including accumulator means 401 and 451, tuning information memories 410, counters 420 and comparators 430 and 440.

Outputs $Q_A$-$Q_D$ of fine tune counters 522, 523 are connected to input terminals $DI_1$-$DI_4$ of fine tune memories 512, 513 and input terminals B0-B3 of comparators 532, 533. A0-A3 of comparators 532 and 533 are connected to $Q_A$-$Q_D$ of counters 422 and 423 (FIG. 4) respectively. The fine tune write signal is coupled to the R/$\overline{W}$ terminals of fine tune memories 512 and 513, the U/D signal coupled to the D/U terminals of the fine tune counters 522 and 523 and a 15 Hz clock signal coupled to the CK terminals of the counters. These signals are all supplied from input logic 200.

The $Q_A$-$Q_D$ of fine tune counters 522, 523 are connected to corresponding inputs of comparators 532, 533 and bear lead designations $F_1$-$F_4$ for comparator 532 and $F_5$-$F_8$ for comparator 533. Outputs $DO_1$-$DO_4$ of memories 512, 513 are connected to inputs $D_A$-$D_D$ of fine tune counters 522, 523, respectively. As the "C" leads were related to the output signal $C_o$, and the "E" leads to the output signal $E_o$, the "F" leads are related to the output signal $F_o$.

As discussed above for the tuning information memories, the memories are individually and simultaneously addressed by the channel number in the channel number counters 304, 305. During operation of counters 422-423 of FIG. 4, output signal $F_o$ is high when the count is less than the fine tune memory content and low when equal to or greater than the memory content. In practice, the count interval is about 1/16 millisecond for $F_o$ and about one millisecond for $C_o$ and $E_o$. The length of time that the $F_o$, $C_o$ and $E_o$ output signals remain at a high logic level is indicative of the memory or accumulator content. When the comparator determines that the counter output is equal to or greater than the memory (or accumulator) content, its output voltage is low and the duration of the high logic level pulse is directly indicative of the stored information. Thus the $C_o$, $E_o$ and $F_o$ signals at the outputs of each of the comparator groups are PWM signals having duty cycles proportional to the digital information stored in the memories and accumulator.

TUNING VOLTAGE GENERATOR 60 (FIGS. 6-9)

Figure 6:
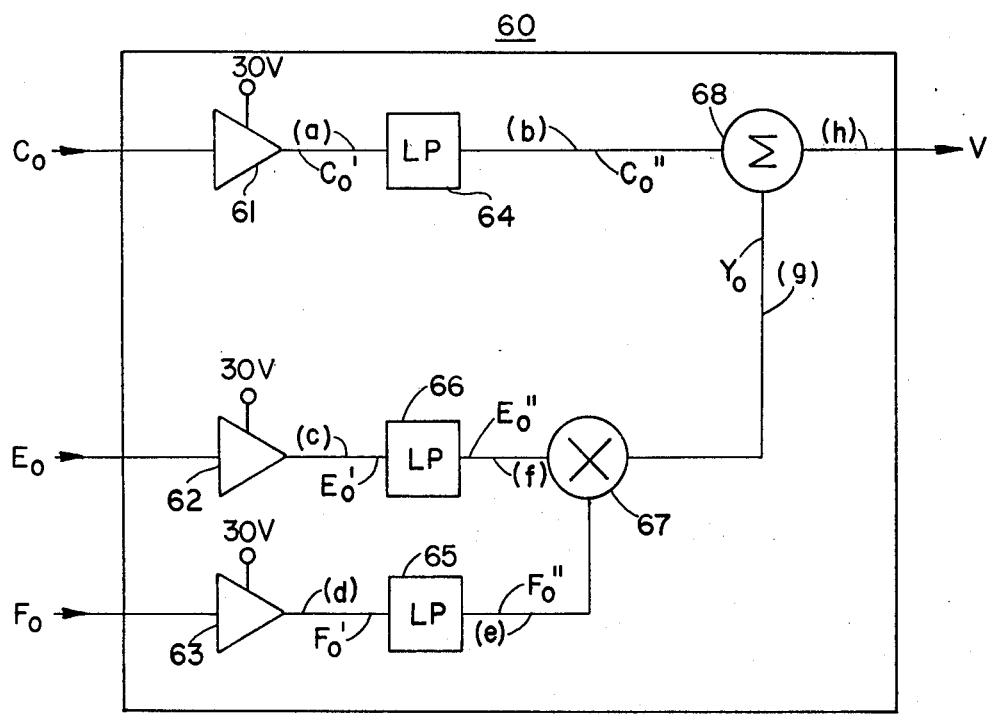
FIG. 6 is a representation of one form of tuning voltage generator 60.

FIG. 6 depicts one implementation of tuning voltage generator 60. The PWM signals $C_o$, $E_o$ and $F_o$ are respectively coupled through a plurality of buffer amplifiers 61, 62 and 63 to produce level shifted PWM signals $C_o'$, $E_o'$ and $F_o'$. Such amplifiers are commonly known in the art and serve to amplify square wave input signals, for example, to the level of the indicated source voltage—in this instance 30 volts. For example, a Texas Instruments type SN7407 device with a "pull-up" resistor to 30 volts may be used. $C_o'$, $F_o'$ and $E_o'$ are supplied to low pass filters 64, 65 and 66 where they are converted into steady state voltages $C_o''$, $F_o''$ and $E_o''$ respectively. $F_o''$ is used as the source for a multiplier 67 to which $E_o''$ is supplied, producing an output signal $Y_o$. $Y_o$ is fed along with $C_o''$ to a summation circuit 68. The final tuning voltage V is produced at the output of operational amplifier summation circuit 68 for application to the tuner. Multiplier 67 is also well-known in the art and may be type MC1594L available from Motorola Inc. It will be appreciated by those skilled in the art that the product of the $E_o''$ and $F_o''$ signals must be divided by the source voltage (30 v) in multiplier 67 to maintain the proper level for combination with $C_o''$.

Figure 5:
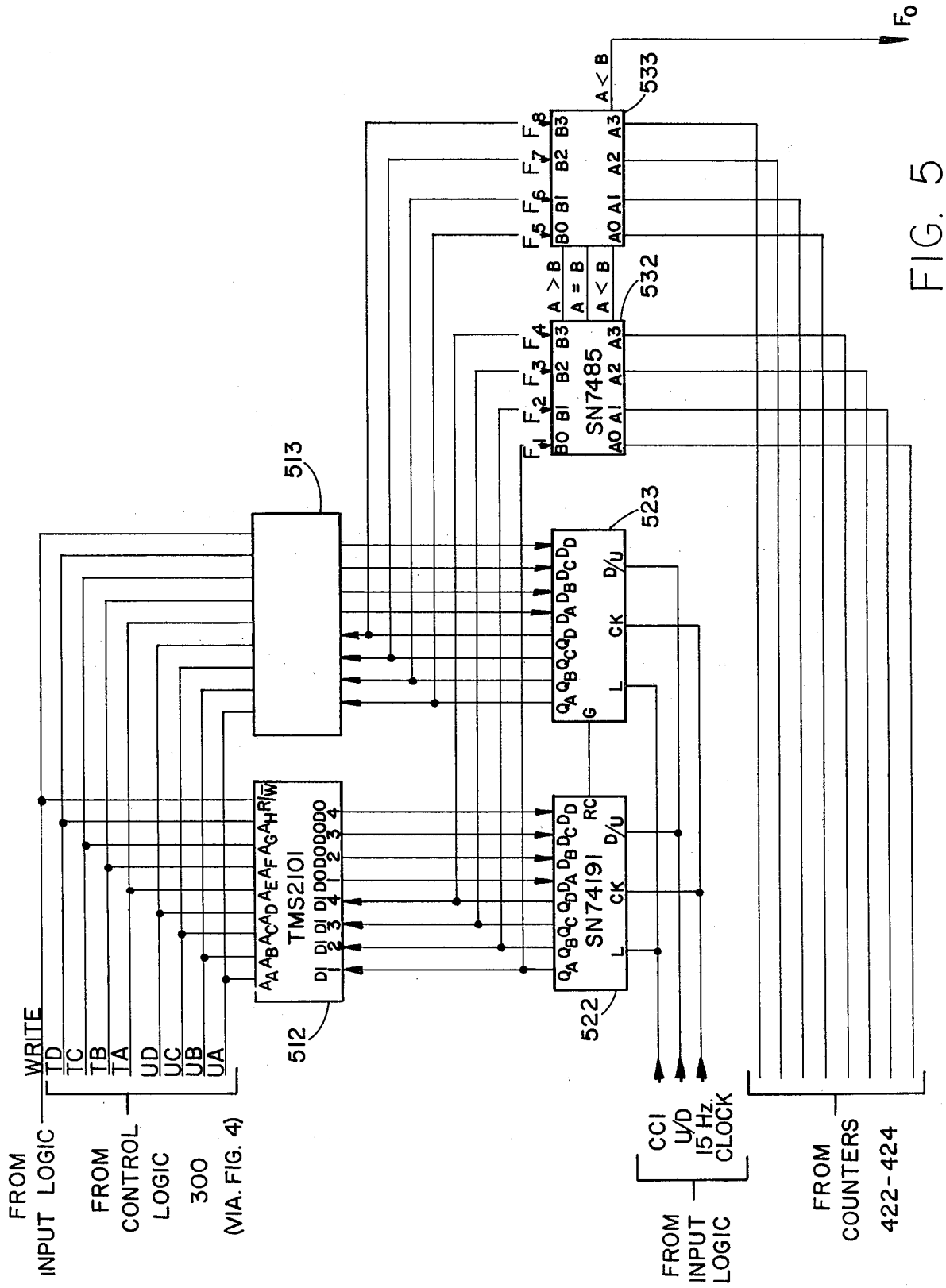
FIG. 5 is a schematic representation of the fine tuning section 500 including fine tune memories 510, fine tune counters 520 and comparator 530.
Figure 8:
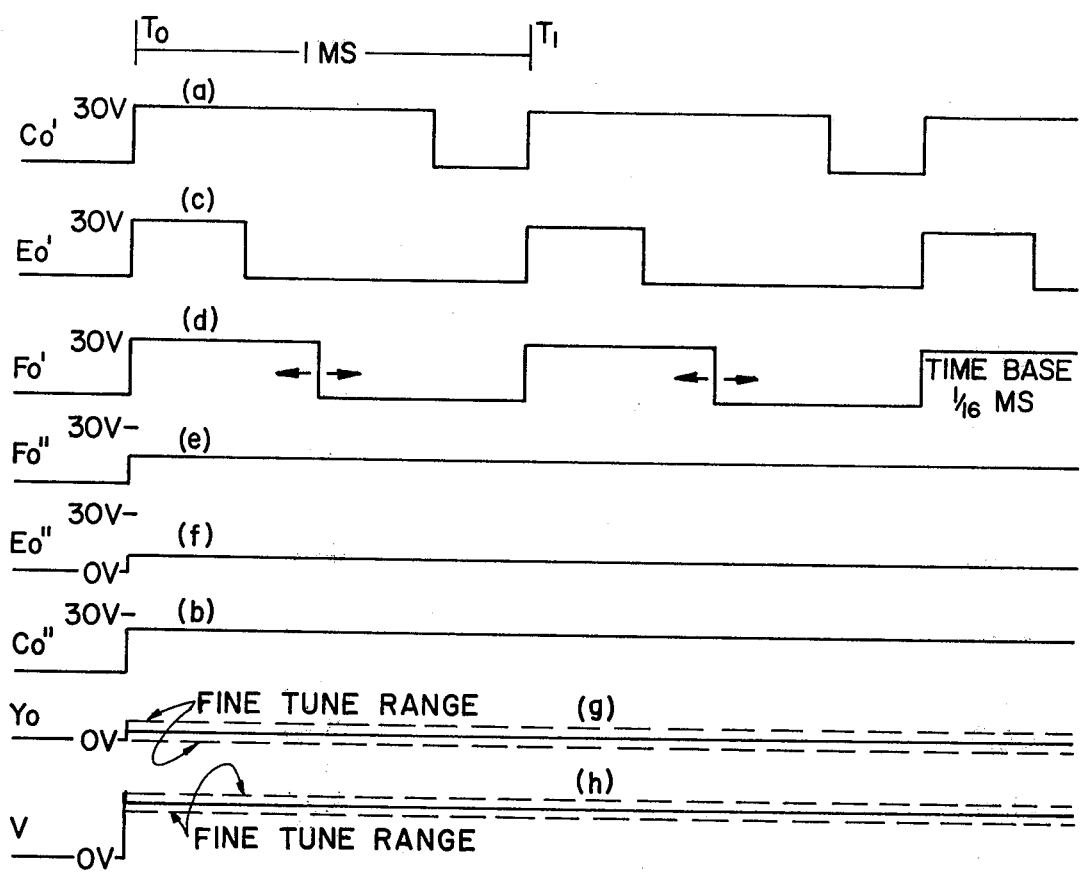
FIG. 8 shows the waveforms associated with the tuning voltage generator of FIG. 6.

Reference to FIG. 8 will help clarify circuit operation. The curves indicated by letters (a) through (h), (and correspondingly marked on the diagram of FIG. 4), indicate the various waveforms of representative signals. $C_o'$ is a pulse of 30 volts amplitude. For the assumed condition, it extends for the major portion of the $T_0$-$T_1$ time cycle (approximately one millisecond in duration). $E_o'$ is a pulse of similar amplitude but (for the assumed condition) of more limited duration. Similarly $F_o'$ has a 30 volt amplitude but a variable duration as indicated by the oppositely-directed horizontal arrows. It should be noted that the time cycle for $F_o'$ is about 1/16 of that shown. For any given channel, $C_o'$ and $E_o'$ are fixed quantities corresponding to nominal tuning and slope factor or last increment information from accumulators 452-454 and accumulators 402-404 respectively, of FIG. 4. The duration of $F_o'$ is determined by the digital information stored in memories 512 and 513 of FIG. 5. The $E_o''$, $F_o''$ and $C_o''$ curves are believed self-explanatory and consist of DC voltages of an amplitude (between 0 and 30 volts) dictated by the duty cycles of the respective $E_o'$, $F_o'$ and $C_o'$ signals. $Y_o$ is $F_o''$ that has been multiplied by $E_o''$ and divided by the source voltage of 30 volts. The $Y_o$ signal has a limited amplitude which represents the permissible fine tuning range. The tuning voltage V is a summation of $Y_o$ and $C_o''$ and is the voltage actually applied to the tuner of the television receiver.

Figure 7:
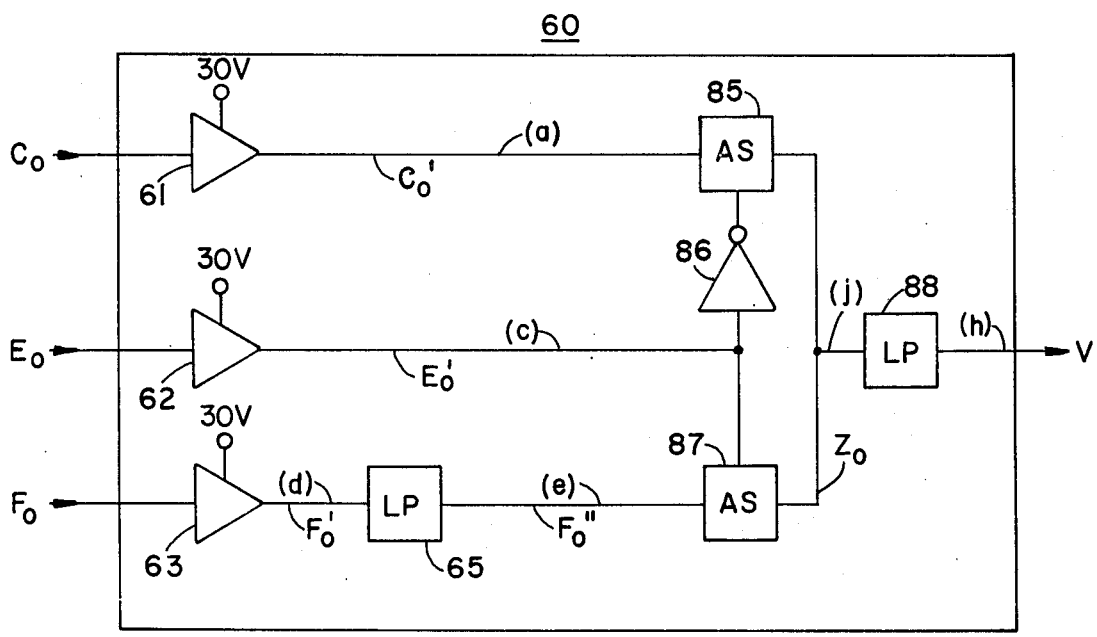
FIG. 7 is a representation of another form of tuning voltage generator 60.

FIG. 7 represents another implementation of tuning voltage generator 60. The $C_o$, $E_o$ and $F_o$ signals are amplified by amplifiers 61, 62 and 63 as described with reference to FIG. 6. The $C_o'$ signal is supplied to a conventional analog switch 85. The $E_o'$ signal is applied through an inverter 86 to analog switch 85. $F_o'$ is supplied to a low pass filter 65 to produce a filtered $F_o''$ signal which is applied to an analog switch 87. $E_o'$ is coupled directly to analog switch 87. The $E_o'$ signal functions as a gate to the analog switches. When it is high (30 volts) it allows $F_o''$ to go through analog switch 87 (and closes analog switch 85) and when low allows $C_o'$ to go through analog switch 85 (and closes analog switch 87) the outputs of analog switches 85 and 87 are combined and applied to a low pass filter 88 which produces the final tuning voltage V shown as waveform (h).

Figure 9:
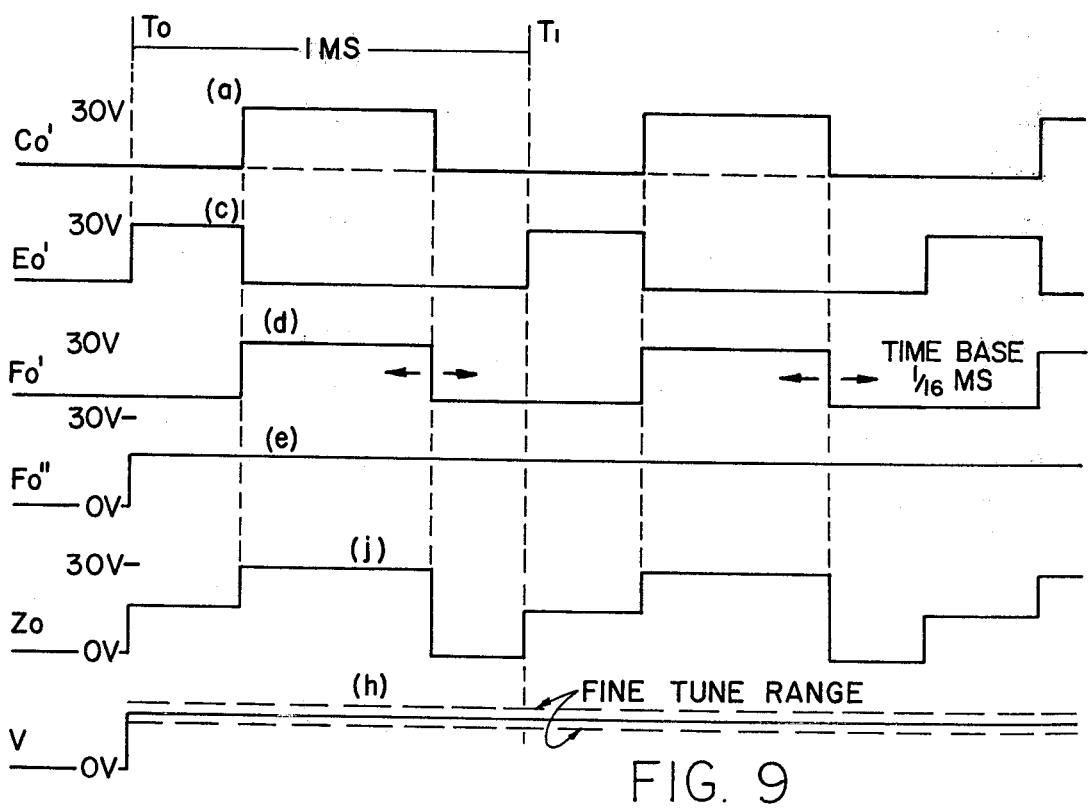
FIG. 9 shows the waveforms associated with the tuning voltage generator of FIG. 7.

The $C_o'$, $E_o'$, $F_o'$ and $F_o''$ waveforms of FIG. 9 are similar to those in FIG. 8. The differences are due to the manner of combining the fine tune voltage to the nominal tuning voltage i.e., analog voltage summation vs. time frame summation. Waveform $Z_o$ represents a combination of $C_o'$ and $F_o''$ and when filtered produces the actual V tuning voltage which is identical to V produced by FIG. 6 implementation.

The illustration of these two tuning voltage generators should show clearly the functional aspects involved. It will be obvious to those skilled in the art that other implementations may readily be used. The particular arrangements are believed well within the scope of the art and are not considered a part of this invention.

The fine tune voltage counters are assumed to be set at the midpoint of their range. In this condition, they develop one-half of the fine tuning voltage available. (The magnitude of fine tuning voltage produced will, of course, depend upon the area of the tuning curve.) The nominal tuning voltage is offset from the tuning curve by the equalized contribution of the fine tuning voltage. In a zero offset system, with a ± fine tuning voltage arrangement, the nominal tuning voltage would lie on the curve. In the specification and claims the term "nominal tuning" should be understood to embrace offset systems as well as those having a fine tuning range centered on zero. Similarly it should be obvious that the DC level of an AFC voltage coupled to the system may need to be offset.

What has been described is a novel method of memory saving and apparatus for a television tuning system in which initial value nominal tuning information and first increment slope information for each band is stored along with second increment tuning information for each channel. Nominal tuning information for any selected channel is computed from the initial value nominal tuning information and first increment tuning information and appropriate second increment tuning information.

What is claimed is:

1. A television tuning system including:
   a voltage controlled tuner having a nonlinear tuning voltage-versus-frequency characteristic;
   memory means storing reference tuning information, first increment tuning information related to the slope of said characteristic at a base channel and second increment tuning information related to the slope of the slope of said characteristic at each channel;
   tuning voltage means generating a tuning voltage for said tuner;
   channel address means accessing said memory means and reading out the corresponding tuning informations; and
   accumulator means coupled between said memory means and said tuning voltage means for generating nominal tuning information for the selected channel from said reference tuning information, said first increment tuning information and said second increment tuning information.

2. A television tuning system as set forth in claim 1 wherein said reference tuning information comprises nominal tuning information for a reference channel, said first increment tuning information represents the change in nominal tuning information between said reference channel and the next adjacent channel and said second increment tuning information represents the change in said first increment tuning information between adjacent channels;
   said accumulator means algebraically adding second increments of tuning information to said first increment of tuning information and to said reference tuning information to derive the nominal tuning information for the selected channel.

3. A television tuning system as set forth in claim 2 wherein the reference channel tuning information is for a channel at one extremity of the frequency band and the first increment tuning information is for an adjacent channel.

4. A television tuning system as set forth in claim 3 wherein the reference channel tuning information and the first increment tuning information correspond to a pseudo channel 6 MHz below the lowest numbered channel in said band, and wherein said accumulator means add second increment tuning information to the pseudo channel tuning informations to derive the nominal tuning information for the selected channel.

5. A television tuning system as set forth in claim 3 further including a source of secondary tuning information;

said accumulator means adding said first and said second increment tuning information to derive a last increment of tuning information;

means proportioning said secondary tuning information by said last increment of tuning information; and means combining said derived nominal tuning information for the selected channel with the proportioned secondary tuning information.

6. The method of operating a television tuning system including a tuner having a nonlinear tuning voltage-versus-frequency characteristic and a channel-number-accessible memory for storing tuning information, comprising the steps of:

storing in said memory reference tuning information, first increment tuning information related to the slope of said characteristic at a base channel and second increment tuning information related to the slope of the slope of said characteristic at successive channel positions;

reading out the reference and first increment tuning informations and the second increments of tuning informations for a selected channel;

computing the nominal tuning information for the selected channel from the read-out tuning informations; and producing a tuning voltage therefrom for said tuner.

7. The method of claim 6 wherein said reference tuning information comprises nominal tuning information for a pseudo channel, said first increment tuning information is representative of the change in nominal tuning information between said pseudo tuning information and said base channel and said second increment tuning information is representative of the change in first increment tuning information between successive channels;

said computing step including the step of:

algebraically summing second increment tuning information with said first increment tuning information and the reference channel tuning information to derive nominal tuning information for the selected channel.

8. The method of claim 7 wherein the pseudo channel is located below the lowest numbered channel in the band and wherein said summing step includes the further step of:

adding the second increment tuning informations of successive higher channels to the first increment tuning information and the nominal tuning information of said pseudo channel.

9. The method of claim 8 further including the steps of:

proportioning a source of secondary tuning information with the summation of the first increment tuning information and the second increment tuning informations corresponding to the selected channel; and combining the derived nominal tuning information for the selected channel with the proportioned secondary tuning information for producing the tuning voltage for said tuner.

10. The method of operating a television tuning system including a tuner having a nonlinear tuning voltage-versus-frequency characteristic and a channel-number-accessible memory for storing tuning information comprising the steps of:

storing in said memory (a) nominal tuning information and first increment tuning information for a pseudo channel;

(b) second increment tuning information for each channel corresponding to the change in first increment tuning information between successive channels including the pseudo channel, said pseudo channel corresponding to a frequency 6 MHz below the lowest numbered channel in the frequency band;

interrogating said memory for a desired channel to read out the pseudo channel tuning informations and one or more of said second increment informations;

computing the nominal tuning voltage information for said desired channel from said pseudo channel information and said second increment information; and producing a tuning voltage therefrom for said tuner.

11. The method of claim 10 further including accumulating means having arithmetic logic units and storage registers, and further comprising the steps of:

transferring to one of said storage registers said first increment tuning information and to another of said storage registers said reference tuning information; and operating said arithmetic logic units to combine said first increment and said reference tuning informations with successive second increment tuning informations.

12. The method of claim 11 further including a channel number counter and a channel number latch, said method further comprising the steps of:

latching the desired channel number in the latch;

resetting the channel number counter and clearing the registers;

operating the channel number counter to count up to the number in the latch; and interrogating said memory to read the appropriate tuning informations into the registers as the counter is stepped.

13. The method of claim 12 further including a viewer operated channel Up/Dn switch for controlling the counter and means displaying the channel number in the latch to the viewer, and further including the steps of:

automatically replacing the number in the latch with the new channel number in the counter at a given repetition rate in response to operation of the Up/Dn switch; and repeating said interrogating and computing steps for each new channel number, said latter steps taking significantly less time to perform than the period of said given repetition rate.

14. A television tuning system including a voltage-controlled tuner having a nonlinear voltage-versus-frequency characteristic and a memory having a plurality of accessible locations storing nominal tuning information for a reference channel, first increment tuning information representative of changes in nominal tuning information between said reference channel and the next adjacent channel and second increment tuning information representative of changes in first increment tuning information between successive pairs of adjacent channels;

a channel number counter for accessing said different memory locations in accordance with channel numbers;

accumulator means coupled to said memory for developing nominal tuning information for a selected channel by combining said nominal tuning information for said reference channel and first increment information with second increment tuning informations between said reference channel and said selected channel; and a tuning voltage generator coupled to said accumulator means for generating a tuning voltage for said tuner from said developed nominal tuning information.

15. A television tuning system as set forth in claim 14 wherein said reference channel is a pseudo channel selected at a point on said characteristic 6 MHz below the frequency corresponding to the lowest numbered channel in the band.

16. A television tuning system as set forth in claim 15 further including control logic means comprising a channel number latch;

a high speed clock;

state counter means driven by said clock for resetting said channel number counter after a channel number change has been stored in said latch and for operating said channel number counter until its count matches the number in said latch; and comparator means disabling said state counter means when the channel number counter counts to the number in said latch.

17. A television tuning system as set forth in claim 16 wherein said accumulator means include arithmetic logic units and storage registers;

said arithmetic logic units either substituting information in said registers or adding information to previous information therein under control of said state counter means.

18. A television tuning system as set forth in claim 17 including means displaying the channel number in the latch and a viewer-operable Up/Dn switch for producing a channel change initiate signal for said control logic means;

said initiate signal comprising a pulse train of predetermined periodicity and changing the count in said channel number counter;

said state counter means being activated by said initiate signal for latching the new channel number, resetting said channel counter, driving said channel counter from its reset count to the count stored in the latch and disabling itself when the number in the channel counter matches the number in the latch.

19. A television tuning system as set forth in claim 18 wherein said state counter means cycles once for each count change in the channel counter, the maximum cycle time of the state counter means being less than the predetermined periodicity of said pulse train.

20. An all-channel television tuning system including a voltage controlled tuner having a nonlinear voltage-versus-frequency characteristic and a memory having a plurality of locations each accessible by a distinct channel number, said channels being numbered consecutively but lying in more than one distinct frequency band;

one or more of said locations in each distinct frequency band storing nominal tuning information for a reference channel in its associated band and first increment tuning information representative of changes in nominal tuning information between the associated reference channel and the next adjacent channel;

others of said locations in each band storing second increment tuning informations representative of changes in first increment tuning information between successive pairs of adjacent channels in each band;

a channel number counter;

accumulator means coupled to said memory for developing nominal tuning information for any selected channel by combining the nominal tuning information and first increment tuning information for its associated reference channel with second increment tuning information between the associated reference channel and the selected channel;

a tuning voltage generator coupled to the said accumulator means for generating a tuning voltage for said tuner from said developed nominal tuning information;

band decoder means determining the proper frequency band for each channel number; and memory location translation means for allocating blocks of memory locations to said different frequency bands.

21. An all-channel television tuning system as set forth in claim 20 wherein said channel number counter generates a BCD tens digit and a BCD units digit corresponding to the respective digits of the selected channel number, said units digits being coupled directly to said memory and said tens digit being routed through said memory location translation means along with the output of said band decoder means.

22. An all-channel television tuning system as set forth in claim 21 wherein said reference channels comprise pseudo channels selected to be 6 MHz below the lowest channels in each band.

* * * * *